United States Patent [19]

Kasai

[11] Patent Number: 5,036,167
[45] Date of Patent: Jul. 30, 1991

[54] BOARD FOR HYBRID INTEGRATED CIRCUIT

[75] Inventor: Norio Kasai, Yokohama, Japan

[73] Assignee: Toshiba Lighting & Technology Corporation, Tokyo, Japan

[21] Appl. No.: 402,854

[22] Filed: Sep. 6, 1989

[30] Foreign Application Priority Data

Sep. 7, 1988 [JP] Japan .................. 63-222413

[51] Int. Cl.$^5$ ............................... H05K 1/00
[52] U.S. Cl. ......................... 174/256; 29/846; 174/255; 174/257; 174/258
[58] Field of Search ............ 174/255, 256, 257, 258; 101/129; 29/846; 428/209

[56] References Cited

U.S. PATENT DOCUMENTS

| | | | |
|---|---|---|---|
| 3,549,784 | 12/1970 | Hargis | 174/52.4 X |
| 4,525,383 | 6/1985 | Saito | 427/89 |
| 4,569,902 | 2/1986 | Saito | 430/313 |
| 4,641,425 | 2/1987 | Dubuission et al. | 174/256 X |
| 4,687,540 | 8/1987 | Singhdeo et al. | 156/630 |
| 4,713,494 | 12/1987 | Oikawa et al. | 174/262 X |
| 4,715,117 | 12/1987 | Enomoto | 174/266 X |
| 4,725,333 | 2/1988 | Leedecke et al. | 156/630 |
| 4,835,038 | 5/1989 | Kaneko et al. | 428/209 |

FOREIGN PATENT DOCUMENTS 0074605 3/1983 European Pat. Off. .
52-37914 3/1977 Japan .

OTHER PUBLICATIONS

Matsuzaki et al., "High-Density Multilayer Wiring Substrate Using Copper Thick Film and Thin Film", Electronic Components Conference, Washington, DC, May 1985, pp. 484-491.
Patent Abstracts of Japan, vol. 3, No. 106 (E-135), Sep. 7, 1979; & JP-A-54 82 700 (NEC Corp.) 02-07-1979.
"New Generation Hybrid Technology", Electronic Materials, Kogyo Chosakai, May 1984, pp. 57 to 60.

Primary Examiner—Morris H. Nimmo
Attorney, Agent, or Firm—Cushman, Darby & Cushman

[57] ABSTRACT

A hybrid integrated circuit comprising a ceramic substrate, a copper plate having a thickness of 1 to 100 μm formed by adhering a copper material to the ceramic substrate, an insulating layer having a thickness of 10 to 100 μm formed on said copper plate by means of screen printing, and a wiring layer having a thickness of 5 to 80 μm formed on said insulating layer by means of screen printing, and a method for manufacturing the same.

4 Claims, 1 Drawing Sheet

BOARD FOR HYBRID INTEGRATED CIRCUIT

BACKGROUND OF THE INVENTION

1. Field of the Invention

This invention relates to a hybrid integrated circuit in which a copper plate is formed directly on the main surface of a ceramic substrate, and a method for manufacturing the same.

2. Description of the Related Art

As electronic devices are miniaturized and lightened, they have been provided with a hybrid integrated circuit having a ceramic substrate made of, for example, alumina and a thick wiring layer formed on a ceramic substrate, by means of screen printing and burning. Also, with the increase of the packaging density of the circuit, hybrid integrated circuits having an insulating layer on a ceramic substrate have been developed.

FIG. 2 shows a conventional hybrid integrated circuit in which a thick copper layer is formed on a ceramic substrate. Ceramic substrate 1 is made of, for example, alumina and thick copper layer 2 is formed thereon. Insulating layer 3 is formed on thick copper layer 2, and wiring layer 4 is formed on insulating layer 3. This hybrid integrated circuit is manufactured as follows. First, conductive copper paste is printed on ceramic substrate 1 by screen printing, and burned in nitrogen atmosphere, resulting in thick copper layer 2. Next, insulating paste is printed on said copper layer 2, and burned in a nitrogen atmosphere, forming insulating layer 3, then conductive copper paste is printed on said insulating layer 3 and burned in nitrogen atmosphere, forming wiring layer 4.

The paste used for forming thick copper layer 2 generally contains copper powder, an organic vehicle, a solvent, etc., all of which are mixed together. When this paste is printed on ceramic substrate 1 and burned, cracked/reaction gas 5 is generated inside thick copper layer 2 and, as a result, a void is formed on the junction between copper layer 2 and insulating layer 3, and/or in insulating layer 3. Hence, the withstanding voltage of layer 3 is low, the adhesion strength is small, and a short circuit is produced. Thus, insulating layer 3 does not function sufficiently.

"Hybrid Technology of New Generations", *Electronic Material*, (May 1984), pp. 51-60, published by Kogyo Chosa Kai Publishing Co., Ltd., discloses a method for directly adhering a copper circuit plate to a ceramic substrate by means of the DBC (Direct Bond Copper) technique, as well as a transistor module formed by that method.

Published Unexamined Japanese Patent Application (PUJPA) No. 52-37914 discloses a method for directly adhering a metal to ceramics or another metal.

SUMMARY OF THE INVENTION

It is the object of the present invention to provide a hybrid integrated circuit having a high withstand voltage and improved adhesive strength, in which the generation of a void is prevented, and a method for manufacturing the same.

According to a first aspect of the present invention, there is provided a hybrid integrated circuit consisting of: a ceramic substrate, a copper plate having a thickness of 1 to 100 $\mu$m formed by adhering a copper material to the ceramic substrate, an insulating layer having a thickness of 10 to 100 $\mu$m formed on the copper layer by means of screen printing, and a wiring layer having a thickness of 5 to 80 $\mu$m formed on the insulating layer by means of screen printing.

According to a second aspect of the present invention, there is provided a method for manufacturing a hybrid integrated circuit comprising the steps of: heating a copper material to approximately the melting point of copper in a non-oxide atmosphere, thereby forming a copper plate having a thickness of 1 to 100 $\mu$m attached on a ceramic substrate; printing insulating paste on at least one portion of the copper layer by screen printing and burning it in a non-oxide atmosphere, thereby forming an insulating layer having a thickness of 10 to 100 $\mu$m; and printing conductive paste on the insulating layer by means of screen printing then burning it in a non-oxide atmosphere, thereby forming a wiring layer having a thickness of 5 to 80 $\mu$m.

DETAILED DESCRIPTION OF THE PREFERRED EMBODIMENTS

Figure 1:
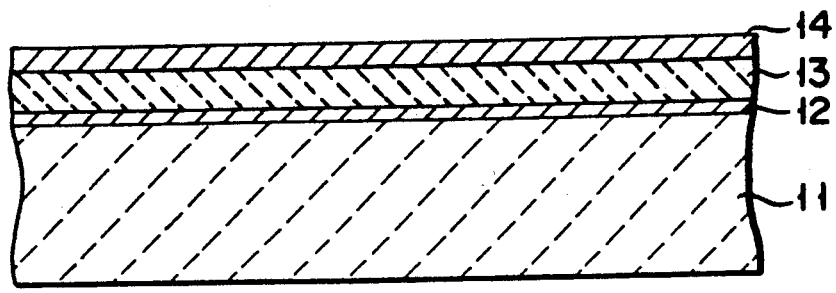
FIG. 1 is a cross sectional view showing the essential part of the hybrid integrated circuit according to an embodiment of this invention.
Figure 2:
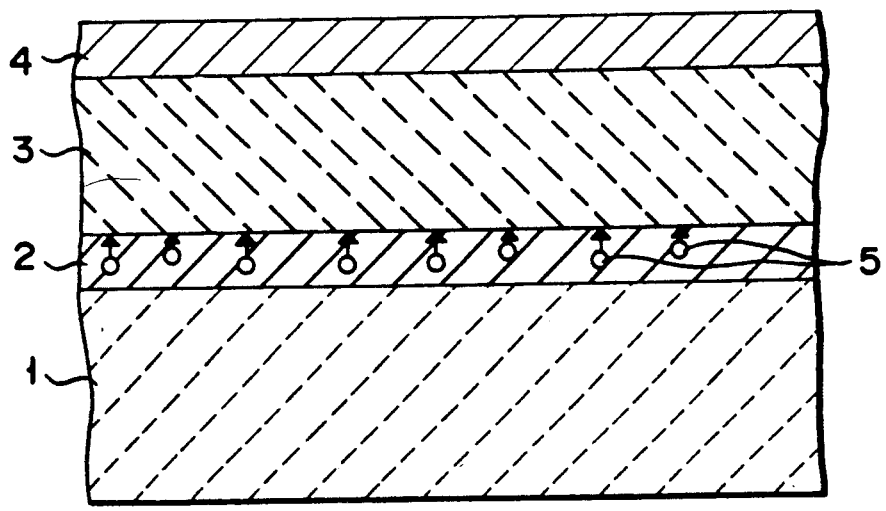
FIG. 2 is a cross sectional view illustrating the conventional hybrid integrated circuit.

An embodiment of the hybrid integrating circuit of this invention will be described below with reference to FIG. 1.

The hybrid integrating circuit consists of ceramic substrate 11 and copper plate 12, insulating layer 13, and wiring layer 14, which are sequentially formed on substrate 11.

According to this embodiment, ceramic substrate 11 is made of alumina. Aluminum nitride, silicon nitride, magnesia, and boron nitride, etc. may be used instead of alumina; however, alumina has the most preferable characteristics.

Copper plate 12 has a thickness of about 20 $\mu$m. It is desirable that plate 12 has this thickness; however a thickness of 1 to 100 $\mu$m may be permissible. The thickness is limited within this range for the following reasons: a copper plate thinner than 1 $\mu$m has difficulty forming on the substrate; and a copper plate thicker than 100 $\mu$m tends to have a rough surface. Copper plate 12 may be formed entirely over the substrate 11 or formed so as to make a pattern.

Insulating layer 13 has a thickness of 40 $\mu$m but a thickness of 10 to 100 $\mu$m may be permissible. Insulating layer 13 is formed as follows: insulating paste containing ZnO glass powder is printed on copper plate 12 by means of screen printing and is burned at a temperature of 600° C. in a nitrogen atmosphere. Insulating layer 13 is made from insulating paste containing ZnO glass powder; however, the material is not limited to such a paste, and paste including $SiO_2$ or calcium titanate may also be used.

Wiring layer 14 has a thickness of 20 $\mu$m but a thickness of 5 to 80 $\mu$m may be permissible. Wiring layer 14 is formed as follows: conductive copper paste is screen printed on insulating layer 13 by and burned at a temperature of 600° C. in non-oxidizing atmosphere (e.g., nitrogen gas, argon gas, etc.). Wiring layer 14 is made of copper; however, the composition is not limited to copper.

According to the above-described embodiment, since the hybrid integrated circuit comprises a ceramic substrate 11 made of alumina, a copper plate 12 formed by adhering copper material on ceramic substrate 11, an insulating layer 13 formed on copper plate 12 by printing, and a wiring layer 14 formed on insulating layer 13 by printing, a void is prevented from being formed on the junction between copper plate 12 and insulating film 13, and/or in insulating film 13. As a result, insulating film 13 has a high withstanding voltage, the adhesion strength of copper plate 12 is improved, and a short circuit is prevented.

A method for producing the above-mentioned hybrid integrated circuit will be described in detail below, based on the result of an experiment.

First, a copper material was put on ceramic substrate 11 and heated at a temperature of 1065° C. in a nitrogen atmosphere. As a result, copper plate 12 having a thickness of about 20 μm was formed on ceramic substrate 11. Copper plate 12 may be formed otherwise by means of coating the ceramic substrate with copper vaporized in vacuum (vacuum deposition).

Next, an insulating paste including ZnO glass powder was screen printed on copper plate 12, and burned at a temperature of about 600° C. in a nitrogen atmosphere. As a result, insulating layer 13 having a thickness of 40 μm was formed on copper plate 12.

Then, conductive copper paste was screen printed on insulating layer 13, and burned at a temperature of about 600° C. in a nitrogen atmosphere. As a result, wiring layer 14 having a thickness of 20 μm was formed on insulating layer 13.

As has been described above, copper plate 12, insulating layer 13, and wiring layer 14 were sequentially formed on ceramic substrate 11, producing a hybrid integrated circuit.

According to the above-described embodiment, a copper material put on ceramic substrate 11 is heated at a temperature of about 1065° C. in a nitrogen atmosphere, thereby forming copper plate 12 having a thickness of about 20 μm. Thereafter, insulating layer 13 having a thickness of 40 μm is formed of insulating paste containing ZnO grass powder on copper plate 12. Hence, a void is not generated on the junction between copper plate 12 and insulating layer 13, and/or in insulating layer 13. Thus, the withstand voltage of insulating layer 13 is increased, the adhesive strength of copper plate 12 with respect to substrate 11 is improved, and a short circuit is not produced.

What is claimed is:

1. A board for a hybrid integrated circuit, comprising:
   a ceramic substrate;
   a copper plate having a thickness of between 1 to 100 μm directly bonded to said ceramic substrate by a heat treatment in a non-oxide atmosphere;
   an insulating layer having a thickness of between 10 to 100 μm and formed on the copper plate by a screen printing method; and
   a wiring layer having thickness of between 5 to 80 μm and formed on the insulating layer by a screen printing method.

2. The board for a hybrid integrated circuit according to claim 1, wherein said ceramic substrate is formed of a material selected from the group consisting of alumina, aluminum nitride silicon nitride, magnesia and boron nitride.

3. The board for a hybrid integrated circuit according to claim 1, wherein said copper plate has thickness of 20 μm.

4. The board for a hybrid integrated circuit according to claim 1, wherein said insulating layer is formed of an insulating paste of ZnO series glass powder.

* * * * *